United States Patent [19]

Hartmann

[11] Patent Number: 5,696,718
[45] Date of Patent: Dec. 9, 1997

[54] DEVICE HAVING AN ELECTRICALLY ERASABLE NON-VOLATILE MEMORY AND PROCESS FOR PRODUCING SUCH A DEVICE

[75] Inventor: Joël Hartmann, Claix, France

[73] Assignee: Commissariat a l'Energie Atomique, Paris, France

[21] Appl. No.: 553,877

[22] Filed: Nov. 6, 1995

[30] Foreign Application Priority Data

Nov. 10, 1994 [FR] France .................................. 94 13556

[51] Int. Cl.$^6$ .................................................. G11C 11/34
[52] U.S. Cl. .................... 365/185.27; 365/185.29; 365/185.18
[58] Field of Search .................... 365/185.01, 185.29, 365/185.18, 185.27

[56] References Cited

U.S. PATENT DOCUMENTS

| | | | |
|---|---|---|---|
| 4,783,766 | 11/1988 | Samachisa et al. . | |
| 5,243,559 | 9/1993 | Murai | 365/185.29 |
| 5,313,086 | 5/1994 | Jinbo . | |
| 5,374,564 | 12/1994 | Bruel . | |
| 5,794,127 | 12/1993 | Nakayama et al. | 365/185.29 |

FOREIGN PATENT DOCUMENTS

| | | |
|---|---|---|
| 2681472 | 10/1993 | France . |
| 4025077 | 1/1992 | Japan . |
| 94/23444 | 10/1994 | WIPO . |

OTHER PUBLICATIONS

Kevin Yallup, "The Implementation Of A Commercial Thick Film SOI Process", published May 1992, page Nos. 43–63.
"Comparison of Current Flash EEPROM Erasing Methods: Stability and How to Control" by K. Yoshikawa et al., IEDM 92, Feb. 1992, pp. 595 to 598.
"A 90ns One-Million Erase/Program Cycle 1-MBit Flash Memory" by Virgil Niles Kynett et al., IEEE Journal of Solid-State Circuits, vol. 24, No. 5, Oct. 1989, pp. 1259–1263.

*Primary Examiner*—David C. Nelms
*Assistant Examiner*—Huan Hoang
*Attorney, Agent, or Firm*—Pearne, Gordon, McCoy & Granger LLP

[57] ABSTRACT

Device having an electrically erasable, non-volatile memory and its production process. In a storage area the device has at least one memory cell (12) of the floating grid type with a source (16) and a drain (18) separated by a channel region (14). According to the invention, the device also comprises means (44,38) for applying a memory cell erasing voltage to the channel region (14), independently of the memory cells of adjacent areas, as a result of a complete electrical isolation or insulation of each area. Application to the production of non-volatile memories which can be carried in satellites for replacing EPROM memories.

6 Claims, 6 Drawing Sheets

DEVICE HAVING AN ELECTRICALLY ERASABLE NON-VOLATILE MEMORY AND PROCESS FOR PRODUCING SUCH A DEVICE

TECHNICAL FIELD

The present invention relates to a device having an electrically erasable, non-volatile memory, as well as to a process for producing such a device. It more particularly relates to a memory device of the total electrical insulation type. The term total electrical insulation is understood to mean an electrical insulation authorizing an independent programming of the different parts of the memory plane of a memory circuit. Such an insulation in particular makes it possible to polarize in a specific manner certain components of the memory without disturbing the operation of the remainder of the circuit. It also permits an increase in the strength and reliability of the memory components, when they are exposed to ionizing radiation, such as X and gamma rays and heavy ions.

The invention has applications more particularly in smart cards of portable computers and memories carried in satellites for replacing EPROM's.

PRIOR ART

Unlike in the case of random access memories of the SRAM type (Static Random Access Memory) or DRAM type (Dynamic Random Access Memory), as yet for non-volatile memories of the Flash-EPROM type (Erasable Programmable Read-Only Memory) or Flash-EEPROM type (Electrically Erasable Read-Only Memory) there is no standard memory cell structure, or standard operation. This is essentially due to the fact that this product generation is still young, but is also due to the problem of electrically erasing memory cells or points, which is very difficult to solve. This problem is the cause of most difficulties encountered for existing components.

Documents (1) and (2), defined at the end of the present description, give more details on memory cells and their erasing mode.

In addition, memory cells of the ETOX type are known (EPROM with thin oxide), which permit erasing by applying a voltage to the source of transistors forming these memory cells. Reference can be made in this connection to document (3) defined at the end of the description. These devices have the advantage of being simple to produce and have an almost total technological compatibility with EPROM's, which is important for semiconductor manufacturers, who are already specialized in this field. However, it causes a problem of electrical consumption and reliability. Thus, the erasing voltage applied to the source must be of the same order of magnitude as the programming voltage when writing, i.e. approximately 12 to 13V. This voltage is also of the same order of magnitude as the avalanche voltage of the source-substrate junction and therefore, during the erasing phase, produces a high leakage current and consequently an electrical consumption which is frequently incompatible with applications of the portable computer type. To obviate this problem, it is also possible to only apply a low positive voltage to the source (0 to 5V) and apply the remainder in the form of a negative voltage to the control grid. This generally makes it necessary to increase the voltage applied to the control grid to above 15V in absolute value. The generation of a negative voltage on an integrated circuit cannot be brought about in simple manner and requires a circuit part dedicated to this. The surface area occupied by the device making it possible to generate this negative voltage can be several $mm^2$, i.e. a non-negligible percentage of the total surface of the circuit. This is a considerable handicap for increasing the integration density.

One of the objects of the present invention is to propose a memory device not suffering from the above disadvantages and permitting the independent programming of different parts of the memory.

Another object is to propose a device permitting the production of such a device, which is both simple and compatible with the requirements of an increase in the integration density of circuits.

DESCRIPTION OF THE INVENTION

For this purpose, the invention more particularly relates to a device having an electrically erasable, non-volatile memory, comprising in at least one part of a substrate, called the storage area, at least one memory cell of the floating grid type having a source and a drain separated by a channel region, characterized in that it comprises a single means for the polarization of the substrate formed by means for applying a memory cell erasing voltage to the channel region and in that the substrate is formed by the upper layer of a SOI (silicon-on-insulator) structure and is of a single conductivity type.

The device according to the invention can comprise a plurality of storage areas mutually insulated by electrical insulation means.

There can be an individual addressing for each storage area. In this case, the erasing voltage application means e.g. comprise, for each storage area, a connection line connected to the substrate part corresponding to the storage area, for the application of the erasing voltage in the channel region or regions by means of the substrate.

According to the invention, this line makes it possible to selectively apply to the corresponding substrate part, an erasing voltage of the memory cell or cells located in said part.

There are also connection lines connected to the grid(s), source(s) and drain(s) of the storage cells(s).

The electrical insulation means more particularly make it possible to avoid mutual disturbances between the storage areas, more particularly during writing and/or erasing operations.

According to a special aspect of the invention, the electrical insulation or isolation means comprise isolation trenches etched in the substrate.

Moreover, as the substrate has a silicon-on-insulator (SOI) type structure, the trenches are etched in silicon and have an adequate depth to reach the insulator, so as to form in the substrate insulated recesses corresponding to the storage areas.

The invention also relates to a process for the production of a device as described hereinbefore. The process essentially comprises the following stages:

formation of a substrate by producing an active semiconductor layer on a stack formed by an electrically insulating layer and a support, formation in the active layer of regions, known as recesses, respectively of the N type and/or P type, formation in the active layer of isolation trenches separating the recesses and extending up to the insulating layer, producing one or more memory cells in the recesses, the cells respectively comprising a drain and a source formed by ion implantation in the active layer on either side of a channel region, as well as a floating grid and a control grid, which are mutually insulated and formed on the surface of the active layer, producing connection lines respectively connected to the drain, source and control grid of each memory cell and to the active semiconductor layer of each recess.

The term recesses is used for parts of the active layer having an either N or P conductivity. The recesses are defined by trenches, which separate and mutually isolate them.

Other features and advantages of the invention can be gathered from the following description of non-limitative embodiments with reference to the attached drawings.

To facilitate understanding all the drawings are not shown to the same scale.

DETAILED DESCRIPTION OF EMBODIMENTS OF THE INVENTION

Figure 1:
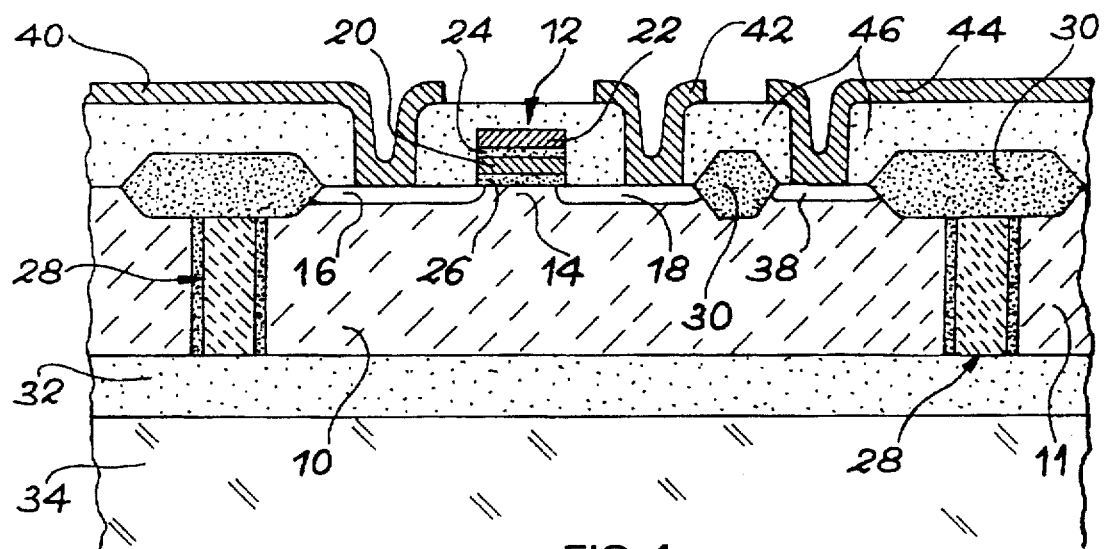
FIG. 1 is a diagrammatic section of a memory device according to the invention.

The device shown in FIG. 1 comprises in a storage area defined by part of the substrate 10, known as a recess, a memory cell 12 with a channel region 14, a source 16, a drain 18, a floating grid 20 and a control grid 22. Insulating layers 24, 26 respectively separate the grids from one another and the grids from the channel region 14. The components formed in the P type recess 10 are e.g. electrically isolated from adjacent recesses 11 by isolation trenches 28. The trenches 28 are advantageously surmounted by field oxide areas 30 in order to define the storage areas. An insulated, buried layer 32, e.g. of silicon dioxide, also contributes to the mutual isolation of the recesses 10, 11 and to their isolation from an e.g. silicon support substrate 34.

According to the invention, the device comprises means 38, 44 for the polarization or application of an erasing voltage to the channel region by means of the substrate 10. When the recess 10 is of the P conduction type, i.e. doped with accepting impurities such as boron, the means 38 comprise an electric contact means with the recess 10 produced by a highly P doped region 38 formed by implantation in the recess 10. The region 38 is advantageously separated from the drain 18 by a field oxide 30. It is possible to see in the drawing metal connection lines 40, 42, 44 respectively connected to the source 16, drain 18 and region 38. These lines are insulated from the memory cell by a dielectric layer 46.

The grids can also have a connection line, but in the case of the drawing said line is directly formed by the control grid 22. The connection line 44 and region 38 make it possible to apply to the recess and consequently the channel region, a memory cell erasing voltage.

Figure 2:
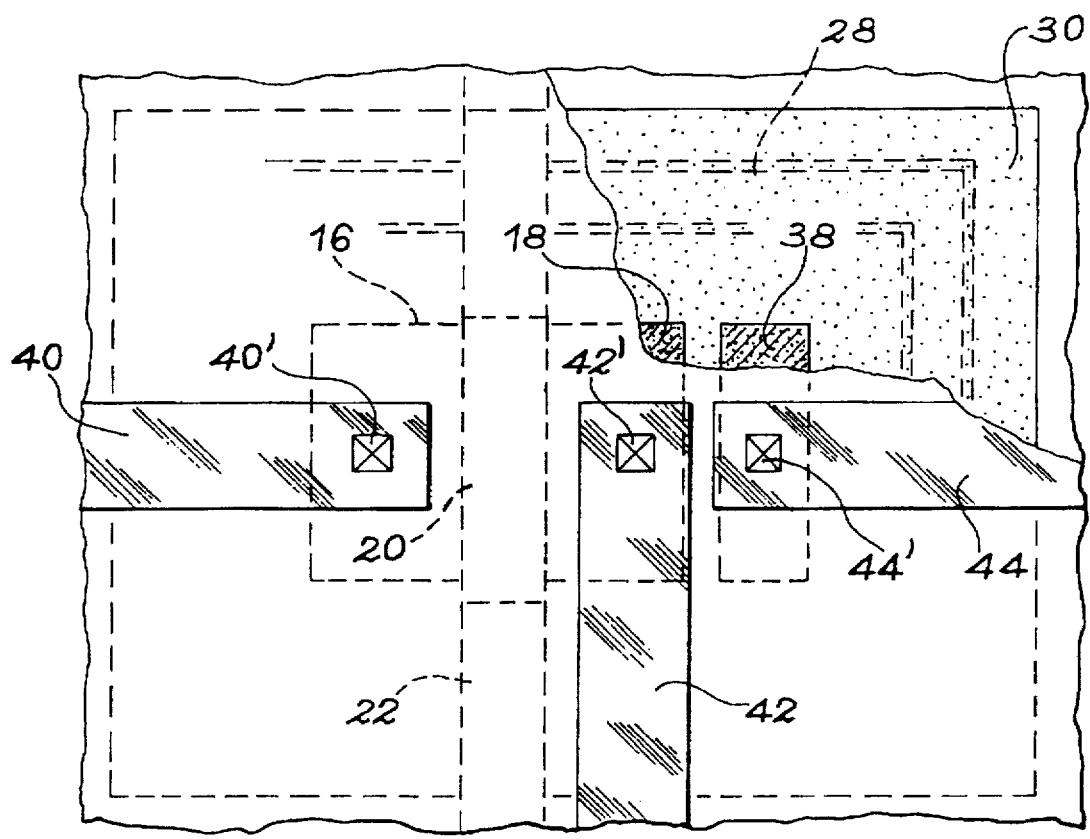
FIG. 2 is a plan view of the device of FIG. 1.

FIG. 2 is a plan view of the device of FIG. 1 and makes it possible to more easily see the lines 40, 42, 44. The contact means of said lines on the source, drain and region 38 are symbolically represented by the references 40', 42' and 44'.

The source 16, drain 18, region 38 and trenches 28 can also be seen in FIG. 2. The floating grid 20 is a block formed beneath the control grid 22.

Figure 3:
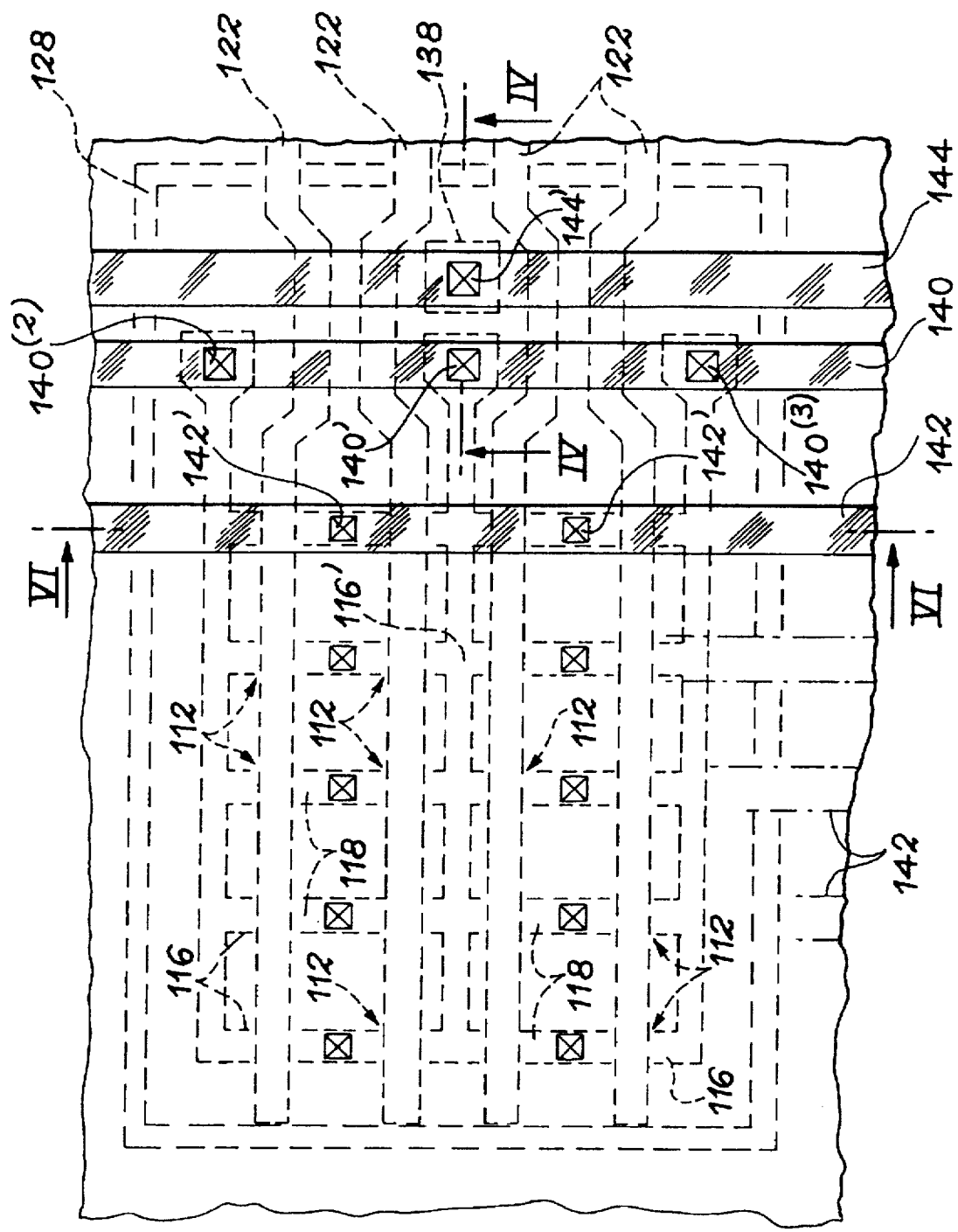
FIG. 3 is a diagrammatic plan view of a device according to the invention comprising a plurality of memory cells.

Whereas FIG. 2 only shows a single memory cell, FIG. 3 gives an implementation example of the invention where the memory cell, i.e. the recess, comprises a plurality of matrixed memory cells.

The device of FIG. 3 comprises twenty memory cells 112, which are arranged in four rows defined by control grids formed by the lines 122 respectively corresponding to the cells 112.

On either side of the control grids, there are source regions 116, 116' and drain regions 118. For reasons of clarity, the references are not given for memory cell patterns repeated in an identical manner.

The sources 116' are interconnected and also connected to an interconnection line 140 in a contact means 140'. In the same way the sources 116 are interconnected and connected to the interconnection line 140 respectively by the contact means $140^{(2)}$ and $140^{(3)}$. The drains 118 are respectively addressed with interconnection lines 142 and connected thereto in contact means 142'.

According to the invention, the device of FIG. 3 also comprises means for polarizing the substrate with a region 138, implanted in the substrate of the recess 110 and connected in a contact means 144' to a line 144.

Moreover, all the cells 112 of the recess are isolated from adjacent recesses by means of an isolation trench 128 making it possible, as will be shown hereinafter, to address, i.e. program, read and erase the cells 112 independently of the remainder of the not shown circuit.

Figure 4:
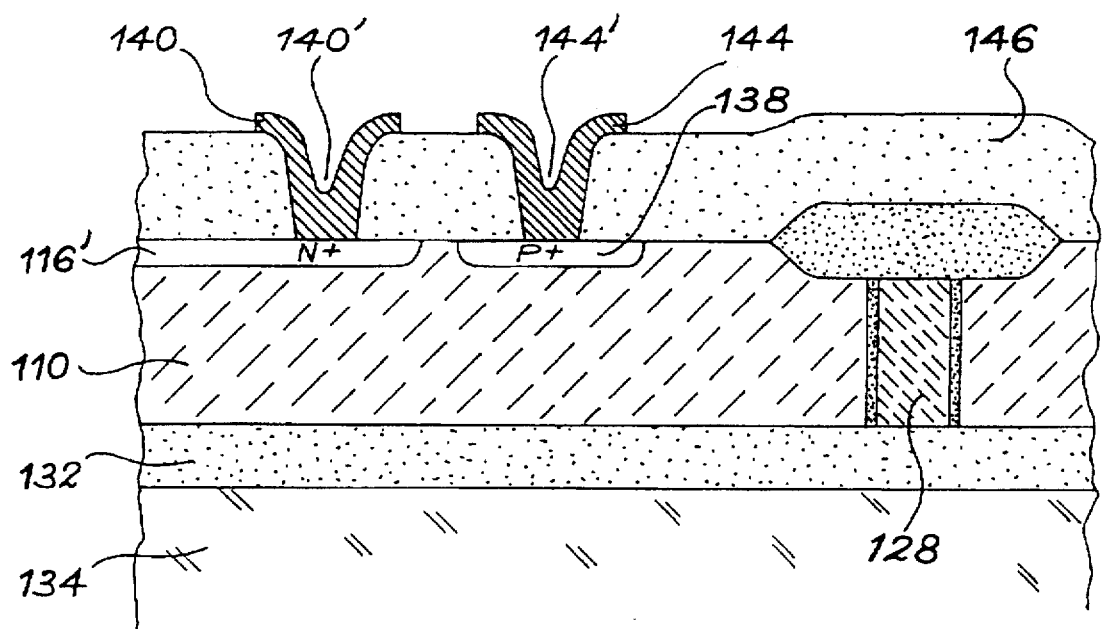
FIG. 4 is a section IV—IV of a detail of FIG. 3.

FIG. 4, which is a detail of FIG. 3 in accordance with a section IV—IV, provides a better understanding of the implementation of the contact means 140' and 144'. The connection lines 140, 144 are insulated from the substrate of the recess 10 by means of a layer 146 of an insulating material, such as e.g. glass doped with boron and phosphorus. They are respectively connected to the source region 116' (of type $N^+$) and to the region 138 (of type $P^+$) by contact means 140', 144'. It is possible to see in FIG. 4 an isolation trench 128 and a buried insulating layer 132.

Figure 5:
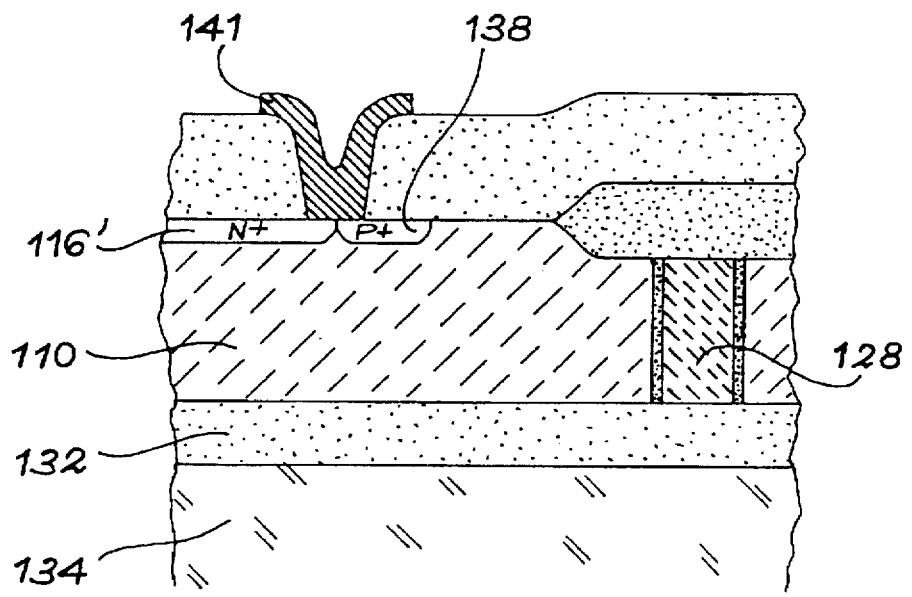
FIG. 5 is a cross-section of a detail of a variant of the device of FIG. 3.

FIG. 5, similar to FIG. 4, shows a variant of the invention, where for a device like that of FIG. 3 the connection lines of the source and the substrate are not separated, instead being common. Thus, the device only has one conducting line 141 connected to the source region 116' and to the region 138.

Figure 6:
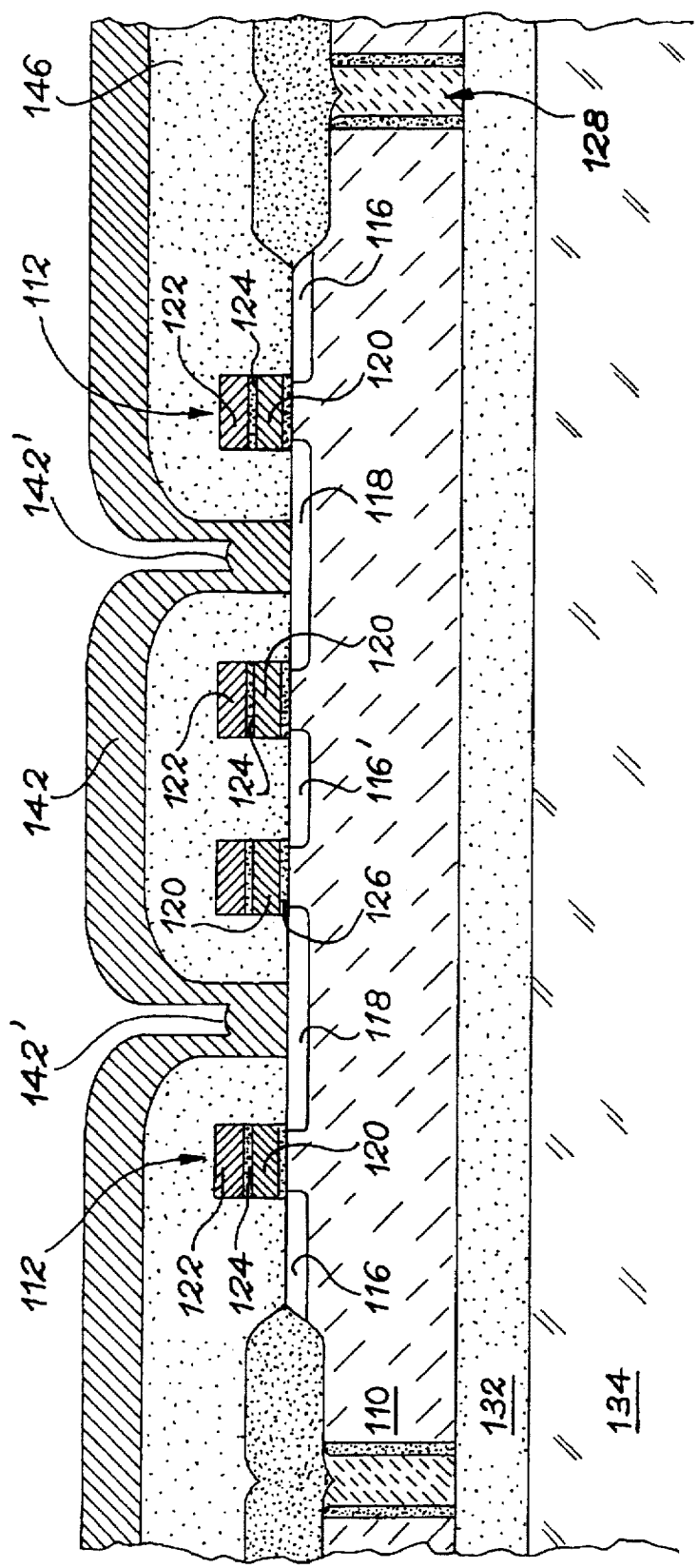
FIG. 6 is a section along VI—VI of the device of FIG. 3.

The device of FIG. 3 can be better understood by referring to FIG. 6, which is a section VI—VI, i.e. along a drain connection line 142.

There are once again components common to the preceding drawings and in particular an e.g. silicon basic substrate 134, an oxide layer 132, an active substrate of the recess 110 and isolation trenches 128. The sources 116, 116' and the drains 118 are shown in section. They are regions implanted in the substrate of the recess 110. It is also possible to see the floating grids 120 and control grids formed by the lines 122, as well as the material layers 124, 126 insulating the grids from one another and with respect to the substrate. The connection line 142 is a conductive layer, e.g. of aluminium, deposited on an insulating layer 146, which insulates it from the memory cells 112. Openings formed in the layer 146 give access to the drain regions 118 on which are formed the contact means 142'.

Table I gives for a device according to FIGS. 3, 4 and 6 the supply conditions for the memory cells 112 in a writing mode, an erasing mode and a reading mode. In table I, the connection lines 142, connected to the drains are designated by "bit line" and the lines 122 connected to the grids and forming the control lines are designed by "word lines".

TABLE I

|  | Writing | Erasing | Reading |
|---|---|---|---|
| Bit line (142) | Vdprog | Floating | Vdread |
| Word line (122) | Vpp | 0 | Vcc |
| Source line (140) | 0 | Floating | 0 |
| Caisson substrate line (144) | 0 | Vpp | 0 |

The abbreviations Vdprog, Vdread, Vpp and Vcc respectively designate the programming potential applied to the drain, the reading potential applied to the drain, the programming potential of the grid and the general supply voltage. For example, it is possible to have the following:

Vdprog=7V,
Vdread=1V,
Vpp=12V,
Vcc=5V

In a variant of the device corresponding to FIGS. 3 and 5, it is possible to electrically connect the source and the substrate. In this case, during erasing, the source and substrate are at the same potential and consequently the source is not floating. Table II summarizes the supply conditions (polarization of the memory cells).

TABLE II

|  |  | Writing | Erasing | Reading |
|---|---|---|---|---|
| Bit line (142) |  | Vdprog | Floating | Vdread |
| Word line (122) |  | Vpp | 0 | Vcc |
| Source line | (141) | 0 | Vpp | 0 |
| Substrate line |  |  |  |  |

As stated hereinbefore, the application of an erasing voltage to the channel region takes place by means of the recess substrate. Thus, the isolation trench delimiting the recess defines the number of memory cells which can be simultaneously erased, erasing taking place by Fowler-Nordheim conduction (or tunnel effect).

As the device can comprise a plurality of storage areas, i.e. a plurality of recesses, the supply line of the substrate 144 must not be common for all the storage areas, otherwise the memory cells would be erased on raising said line to the potential Vpp. In order to be able to selectively erase the memory cells of a recess, surrounded by an isolation trench, an additional selection transistor can be provided.

Figure 7:
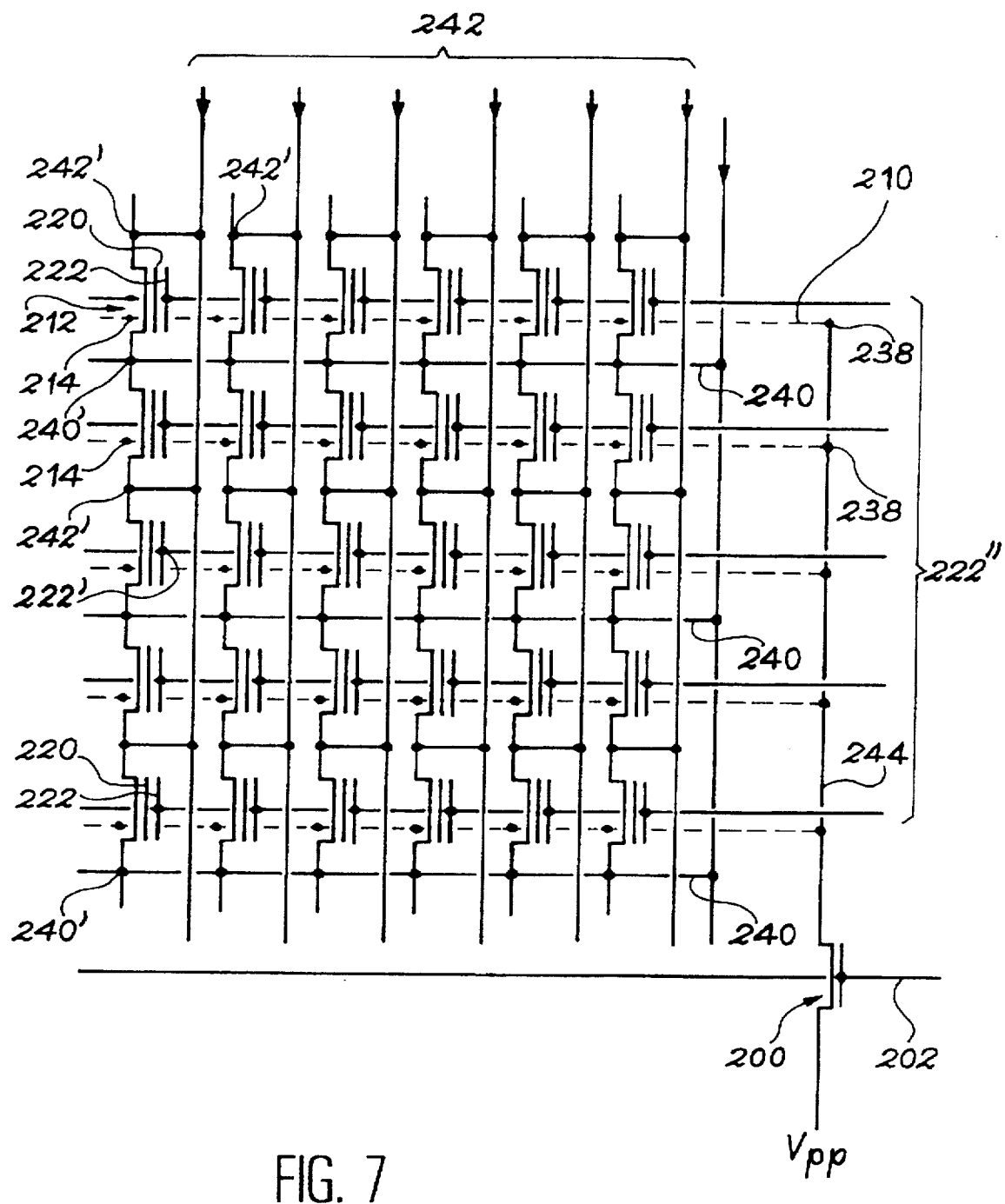
FIG. 7 is an electronic diagram of a device according to the invention.

FIG. 7 is an electronic diagram of a device according to the invention given in exemplified manner. FIG. 7 shows a matrix of 6×5 memory cells 212, each having a floating grid 220 and a control grid 222.

The references 240', 242' and 222' respectively designate the contact means of the connection lines 240 on the memory cell sources, bit lines 242 on the memory cell drains and word lines 222" on the control grids 222.

An erasing line 244 is connected to the substrate in contact means 238. Virtual lines 210 in broken line form connecting the contact means 238 to the channel regions 214 of the memory cells 212 show that the erasing potential is applied in these regions via the recess substrate.

Due to the repetitive pattern of the memory cells 212 and for reasons of clarity, the references are not systematically repeated.

A selection transistor 200 makes it possible to apply an erasing voltage Vpp to the substrate by means of the line 244, when a corresponding storage area selection pulse is applied to its grid by means of a selection line 202. Thus, by means of the transistor 200, it is possible to erase the memory cells 212 independently of those of another, not shown storage area.

Figure 8:
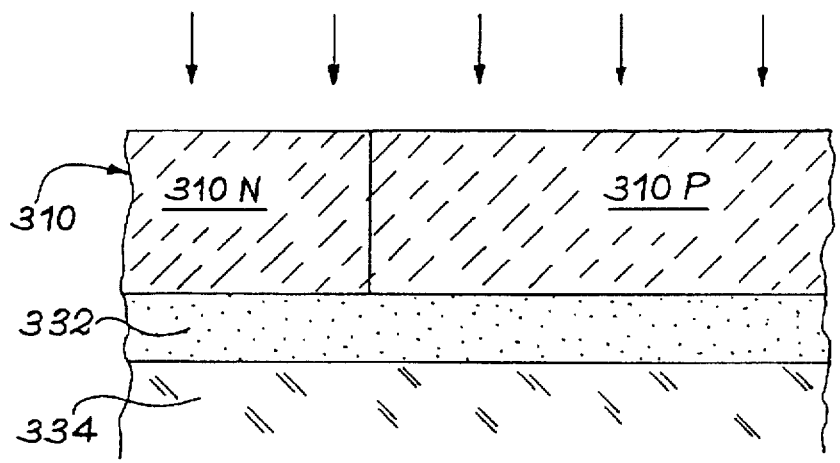
FIGS. 8 to 10 are diagrammatic cross-sections illustrating production stages for a device according to the invention.
Figure 9:
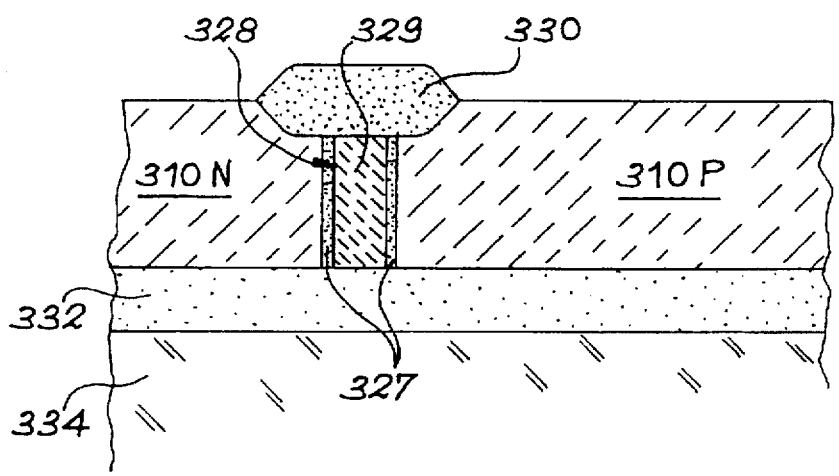
Figure 10:
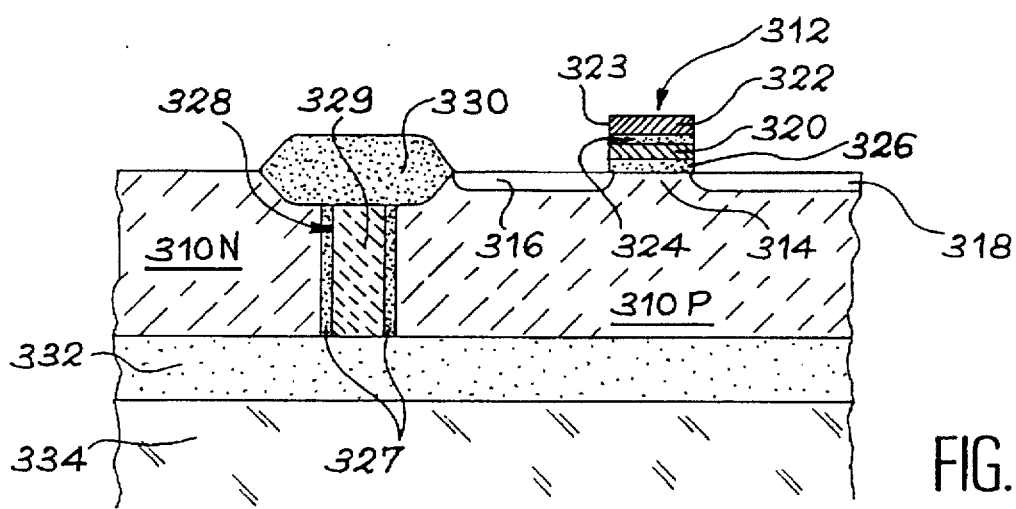

FIGS. 8 to 10 show in exemplified form the stages of a process for producing a device according to the invention.

A first stage, illustrated in FIG. 8, consists of the preparation of a substrate. On a silicon, basic support 334 is formed an insulating, buried layer 332, e.g. of silicon dioxide, surmounted by a silicon, active substrate layer 310. The layers 332 and 310 e.g. have respective thicknesses of 300 nm and 1.2 µm. This structure can e.g. be obtained by oxygen ion implantation and annealing at high temperature, or by the transfer of a silicon film to a silicon dioxide layer previously produced on the support. Reference can be made in this connection to document (4) defined at the end of the description.

The process continues by the implantation in the substrate of phosphorus and/or boron ions in order to form substrate parts 310N and/or 310P respectively N and P doped, said parts being called "recesses" and correspond to the storage areas. The different implantation types are implemented by using masks. Ion implantation is followed by high temperature annealing, e.g. 1100° C. As shown in FIG. 9, this is followed by photoengraving of one or more trenches 328. This engraving is e.g. carried out by the dry method using as the reactive gas $SF_6$. A thermal oxidation operation at 1000° C. under dry oxygen makes it possible to oxidize the sides 327 of the trenches over a thickness of approximately 100 nm. This is followed by a low pressure chemical vapour deposition (LPCVD) of polycrystalline silicon 329 over a thickness of 1.5 µm in order to completely fill the trenches. A total dry engraving with reactive gas $SF_6$ ensures that polycrystalline silicon 329 is only left in the interior of the trenches 328. The trench shown in FIG. 9 consequently makes it possible with the buried layer 332 to isolate the recesses 310N and 310P. For further information on these operations reference can be made to document (5) defined at the end of the description. Field oxide regions 330 are produced by localized oxidation according to a localized oxidation of silicon or LOCOS process.

The production of the device continues by the formation of memory cells 312 and not shown selection transistors. This involves the adjustment of the doping in the channel regions 314, the formation of a grid oxide layer 326 and the formation of grids. The floating and control grids 320, 322 respectively are made from doped polycrystalline silicon and separated by a dielectric 324. The dielectric 324 can comprise a stack of three layers, successively of silicon dioxide, silicon nitride and then silicon dioxide. The control grid 322 is self-aligned with respect to the floating grid 320.

The formation of the grids can also be completed by an oxidation of their sides 323. This is followed by the formation of the source and drain regions 316, 318 respectively of the memory cells 312 and not shown selection transistors, as well as the contact region on the substrate. These regions can be formed by implantation of ions (e.g. arsenic $3.10^{-5}$ at/cm$^2$ at 60 keV for type $N^+$ regions and boron, e.g. $3.10^{15}$ at/cm$^2$ at 45 keV for the type $P^+$ regions).

The process continues by the production of connection lines connected to the drain and source of each memory cell and to the substrate of each storage area. Reference can be made in this connection to the already described FIGS. 1, 3, 4, 5 and 6.

Deposition and creep of a boron and phosphorus doped glass (cf. references 46, 146) ensures the insulation of the connection lines from the polycrystal-line silicon grids and the substrate. In said layer are etched contact holes for producing contact means. The production of the contact means e.g. involves the metallization of contact holes by the deposition of a bilayer (Ti/TiN) performed by cathodic sputtering, followed by their filling with tungsten.

An Al-Cu alloy layer with 0.5% copper is deposited and then etched in order to form the connection lines. A phosphorus-doped glass passivating layer can be deposited on the complete structure. Weld spots are then etched in said layer to give access to the connection lines.

DOCUMENTS REFERRED TO IN THE PRESENT APPLICATION (1) U.S. Pat. No. 4,783,766
(2) "Comparison of Current Flash EEPROM Erasing Methods: Stability and How to control" by K. Yoshikawa et al., IEDM 92, pp 595 to 598
(3) "A 90ns One-Million Erase/Program Cycle 1-MBit Flash Memory" by Virgil Niles Kynett et al., IEEE Journal of Solid-State Circuits, vol. 24, No. 5, October 1989, pp 1259–1263
(4) FR-A-2 681 472
(5) "The Implementation of a Commercial Thick Film SOI Process" by Kevin Yallup et al., pp 43–63.

I claim:

1. Device having an electrically erasable, non-volatile memory, comprising in at least one part of a substrate, called the storage area, at least one memory cell of the floating grid type having a source and a drain separated by a channel region, characterized in that the device comprises a single means for polarization of the substrate by applying a first memory cell erasing voltage to the channel region in an erasing mode and applying a second voltage to the channel in reading and writing modes and further characterized in that the substrate is formed by the upper layer of a SOI (silicon-on-insulator) structure and is of a single conductivity type.

2. Memory device according to claim 1, characterized in that the device comprises a plurality of mutually insulated storage areas.

3. Memory device according to claim 1, characterized in that the application means for an erasing voltage comprise, for each storage area, a connection line connected to the substrate part corresponding to the storage area, in order to apply the erasing voltage in the channel region by means of said substrate.

4. Memory device according to claim 3, characterized in that the device comprises selection transistors for the connection lines for the application of erasing voltages selectively to each storage area.

5. Memory device according to claim 2, characterized in that the device comprises isolation trenches etched in the substrate for isolating the storage area.

6. Memory device according to claim 5, characterized in that the substrate has a silicon-on-insulator (SOI) type structure, the isolation trenches being etched in the silicon and have an adequate depth to reach the insulator, so as to form in the substrate insulated recesses corresponding to the storage areas.

* * * * *

UNITED STATES PATENT AND TRADEMARK OFFICE
CERTIFICATE OF CORRECTION

PATENT NO. : 5,696,718
DATED : December 9, 1997
INVENTOR(S) : Hartmann

It is certified that error appears in the above-indentified patent and that said Letters Patent is hereby corrected as shown below:

On title page, under References Cited - U.S.
   Patent Documents, delete "5,794,127  12/1993  Nakayama et al. .....365/185.29" and insert --5,179,427  1/1993 Nakayama et al. .....365/185.29--.

Signed and Sealed this

Twenty-first Day of April, 1998

Attest:

BRUCE LEHMAN

Attesting Officer       Commissioner of Patents and Trademarks